(12) United States Patent
Tyan

(10) Patent No.: US 6,693,296 B1
(45) Date of Patent: Feb. 17, 2004

(54) OLED APPARATUS INCLUDING A SERIES OF OLED DEVICES

(75) Inventor: Yuan-Sheng Tyan, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/213,853

(22) Filed: Aug. 7, 2002

(51) Int. Cl.[7] .............................................. H01L 31/00
(52) U.S. Cl. ..................... 257/40; 315/169.3
(58) Field of Search ................ 315/169.3; 313/503, 313/504, 505; 257/40, 89, 88, 103, 70

(56) References Cited

U.S. PATENT DOCUMENTS

| | | | |
|---|---|---|---|
| 4,476,292 A | | 10/1984 | Ham et al. |
| 5,247,190 A | * | 9/1993 | Friend et al. ................. 257/40 |
| 6,337,492 B1 | * | 1/2002 | Jones et al. ................... 257/40 |
| 6,583,776 B2 | * | 6/2003 | Yamazaki et al. ............ 345/77 |

* cited by examiner

*Primary Examiner*—James Clinger
*Assistant Examiner*—Chuc Tran
(74) *Attorney, Agent, or Firm*—Raymond L. Owens

(57) ABSTRACT

An OLED apparatus including a substrate, a plurality of spaced apart bottom electrodes disposed over the substrate; a plurality of spaced apart organic EL elements disposed over the spaced apart bottom electrodes and each one of the spaced apart organic EL elements extending over an edge of its corresponding spaced apart bottom electrode; and a plurality of spaced apart top electrodes with each spaced apart top electrode disposed over a substantial portion of its corresponding spaced apart organic EL element forming a device and extending into electrical contact with the next adjacent spaced apart bottom electrode so that current flows between each corresponding spaced apart bottom and top electrodes through the corresponding spaced apart organic EL element into the next spaced apart bottom and top electrodes and spaced apart organic EL elements so that a series connection of devices is provided which reduces power loss due to series resistance.

29 Claims, 6 Drawing Sheets

100

200

OLED APPARATUS INCLUDING A SERIES OF OLED DEVICES

CROSS REFERENCE TO RELATED APPLICATIONS

Reference is made to commonly assigned U.S. patent application Ser. No. 10/214,035 filed concurrently herewith, entitled "Serially Connecting OLED Devices for Area Illumination" by Ronald S. Cok et al, and U.S. patent application Ser. No. 10/077,270 filed Feb. 15, 2002 entitled "Providing an Organic Electroluminescent Device Having Stacked Electroluminescent Units" by Liang-Sheng L. Liao et al. the disclosures of which are incorporated herein by reference.

FIELD OF THE INVENTION

This invention relates to large area organic light emitting device (OLED) and to methods to reduce power consumption due to series resistance and to methods to reduce detrimental impact due to shorting defects.

BACKGROUND OF THE INVENTION

Organic light emitting devices (OLED) generally can have two formats known as small molecule devices such as disclosed in commonly-assigned U.S. Pat. No. 4,476,292 and polymer OLED devices such as disclosed in U.S. Pat. No. 5,247,190. Either type of OLED device is typically a thin film structure comprising an organic EL element sandwiched between a cathode layer and an anode layer formed on a substrate such as soda-lime glass. The organic EL element can actually be constructed of several layers including a hole-injecting layer, a hole-transporting layer, a light-emitting layer, an electron-transporting layers, and an electron-injecting layer. Not all these layers, with the exception of the light-emitting layer, need to be present in a particular OLED device; on the other hand there may be additional functional layers in the device as well. The light-emitting layer may be selected from any of a multitude of fluorescent or phosphorescent organic materials. The light emitting-layer may also include multiple sub-layers. When a potential difference is applied between the anode and the cathode, negatively charged electrons move from the cathode layer into the OLED device. At the same time, positive charges, typically referred to as holes, move from the anode layer into the OLED device. When the positive and negative charges meet, they recombine and produce photons. The wavelength, and consequently the color, of the photons depend on the electronic properties of the organic material in which the photons are generated. In an OLED device either the cathode layer or the anode layer is transparent to the photons generated, allowing the light to emit from the device to the outside world.

An OLED device can also have a stacked structure as taught in U.S. Pat. No. 6,337,492. The OLED device having a stacked structure (a stacked OLED device) comprises a top electrode, a bottom electrode, and a plurality of individual light emitting devices vertically stacked between the top electrode and the bottom electrode. A pair of inter-device electrodes are also provided between the neighboring individual light emitting devices. These inter-device electrodes are to inject electrons and holes, respectively, to the individual light emitting devices above and below them, and to electrically connect these two individual light emitting devices. The individual light emitting devices in the stack are thereby connected in series. In operation, electricity is applied between the top electrode and the bottom electrode. The same current flows through all the individual light emitting devices in the stack and the applied voltage is divided among all the individual light emitting devices in the stack. The inter-device electrodes are commonly 0.1 to 15 nm thick, and include allegedly transparent metal alloys, metal oxides, and other well known inorganic electrode materials commonly used in OLED devices.

The OLED devices are low voltage, high current devices. A typical device operates at 3–10 volts of voltage and has about 1 to 10 Cd/A of light-generating efficiency. For many display or lighting applications, a brightness of about 1000 $Cd/m^2$ is required. The operating current, therefore, has to be about 100 $A/m^2$ to 1000 $A/m^2$. These characteristics are ideal for small devices such as those for portable applications that require device areas less than about 0.01 $m^2$. When device area increases, however, these characteristics lead to practical problems. For example, some lighting applications may require devices with area as large as 1 $m^2$. The operating current in these devices can be as high as 100 A to 1000 A. Since the anode and cathode layers are thin-films having limited electrical conductivity, they are not able to carry these high currents without substantial energy loss due to series resistance. This problem is accentuated since one of the electrode layers also has to be optically transparent to allow emitted light to get through. If a stacked OLED device is used, the situation is somewhat improved. If a stacked OLED and a non-stacked OLED device are operated at the same light output level, the operating current of the stacked OLED device equals I/N where I is the current of the non-stacked OLED device and N is the number of individual light emitting elements in the stacked OLED device. The lowered operating current results in lowered power loss due to series resistance. However, since the total number of cells in the stack is limited by practical factors, A stacked OLD device is still a relative low voltage, high current device and the energy loss due to series resistance is still a serious problem.

Another common problem encountered in making large area OLED devices is failure due to shorting defects. Since OLED devices use very thin layers, pinholes, dust particles, and many other kinds of defects can cause shorting between the anode and the cathode. Applied electricity will go through the shorting defect instead of the light-emitting device. A single shorting defect can cause an entire OLED device to fail. Even with the best efforts practiced in manufacturing, it is difficult to eliminate all shorting defects in large area thin-film electrical devices. Assuming the defects are randomly distributed, the probability of finding X defects in a device of area A with a defect density of $N_d$ can be expressed by $$P(X, A, N_d) = [(A \cdot N_d)^X \exp(-A \cdot N_d)]/X!$$

Thus the probability of having a defect free device of area A is $$P(0, A, N_d) = \exp(-A \cdot N_d).$$

The probability decreases exponentially with increasing area. For example, even if the defect density is as low as $0.001/cm^2$, the probability of having a defect free 1 $m^2$ device is only 36.8%. Thus for making large area OLED devices practical, it is imperative to find solution to the shorting defect problem.

SUMMARY OF THE INVENTION

It is therefore an object of the present invention to provide an improved large-area OLED apparatus with reduced detrimental impacts due to series resistance and shorting defects.

This object is achieved by providing an OLED apparatus comprising:

(a) a substrate;

(b) a plurality of OLED devices including spaced apart bottom electrodes disposed over the substrate;

(c) each one of the plurality of OLED devices including at least one organic layer extending over an edge of its corresponding spaced apart bottom electrode; and (d) each one of the plurality of OLED devices including a top electrode spaced apart from the top electrodes of other OLED devices and extending into electrical contact with the spaced apart bottom electrode of a neighboring OLED device so that a series connection of OLED devices is provided and current flows between the spaced apart top and bottom electrodes of each OLED device and from the spaced apart bottom electrode of such OLED device to the spaced apart top electrode of the next OLED device which reduces power loss due to series resistance.

An advantage of the present invention is a reduced energy loss due to series resistance. Another advantage of apparatus made in accordance with this invention is a reduced impact due to shorting defects. A further advantage of the apparatus made in accordance with this invention is that it can be designed to have tunable color. Another further advantage of the apparatus is that it can use stacked cells to further improve its performance. A still further advantage of the present invention is that the apparatus can be manufactured at low cost. The present invention is particularly suitable for forming large-area OLED apparatus.

Additional objects and advantages of the invention are set forth, in part, in the description which follows, and, in part, will be apparent to one of ordinary skill in the art from the description and/or from the practice of the invention.

DETAILED DESCRIPTION OF THE PREFERRED EMBODIMENTS

Figure 1:
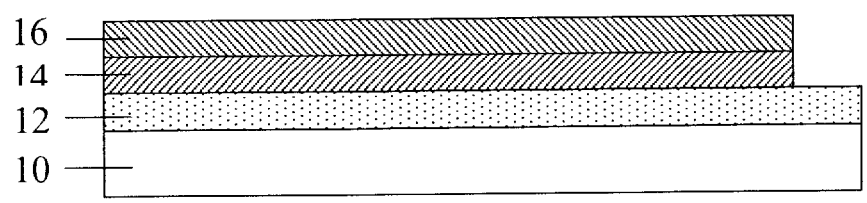
FIG. 1 is a schematic illustration of the cross section of a conventional OLED device.
Figure 2:
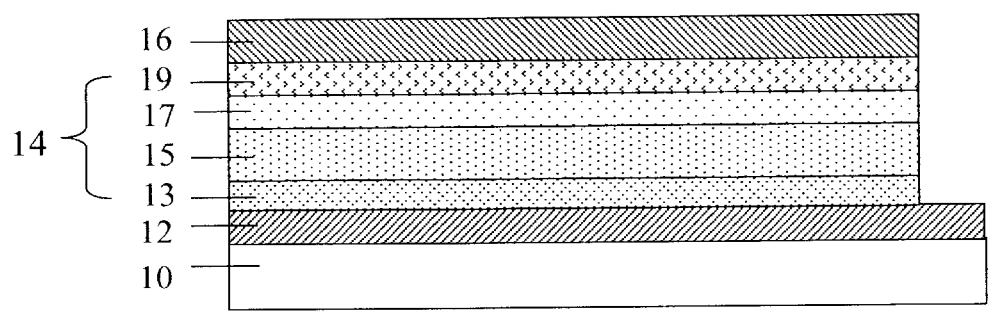
FIG. 2 is a schematic illustration of the cross section of a conventional OLED device wherein the organic EL element includes several layers.

FIG. 1 is a schematic illustration of the cross section of a typical OLED device 100 including a substrate 10, an anode layer 12, an organic EL element 14, and a cathode layer 16. There are numerous configurations of the organic EL element 14 wherein the present invention can be successfully practiced. A typical structure 200 is shown in FIG. 2 and is comprised of a substrate 10, an anode layer 12, an organic EL element 14 and a cathode layer 16, wherein organic EL element 14 includes an hole-injecting layer 13, a hole-transporting layer 15, a light-emitting layer 17, and an electron-transporting layer 19. The total combined thickness of EL organic element 14 is preferably less than 500 nm. These layers are described in detail below. Note that the substrate may alternatively be located adjacent to the cathode, or the substrate may actually constitute the anode or cathode.

Substrate

The OLED apparatus of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

Anode

When EL emission is viewed through anode 12, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes or by using shadow masks during preparation.

Hole-Injecting Layer (HIL)

It is often useful to provide a hole-injecting layer 13 be provided between anode 12 and hole-transporting layer 15. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in commonly-assigned U.S. Pat. No. 4,720,432, and plasma-deposited fluorocarbon polymers as described in commonly-assigned U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 15 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al in commonly-assigned U.S. Pat. Nos. 3,567,450 and 3,658,520.

A more preferred class of aromatic tertiary amines are those which include at least two aromatic tertiary amine moieties as described in commonly-assigned U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in commonly-assigned U.S. Pat. Nos. 4,769,292 and 5,935,721, the light-emitting layer (LEL) 17 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in commonly-assigned U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo {f}-8-quinolinolato]zinc (II)
CO-4: Bis(2-methyl-8-quinolinolato)aluminum(III)-$\mu$-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato) zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2,2',2"-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Electron-Transnorting Layer (ETL)

Preferred thin film-forming materials for use in forming the electron-transporting layer 19 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in commonly-assigned U.S. Pat. No. 4,356,429 and various heterocyclic optical brighteners as described in commonly-assigned U.S. Pat. No. 4,539,507. Benzazoles and triazines are also useful electron-transporting materials.

In some instances, layers 17 and 19 can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Cathode

When light emission is viewed solely through the anode, the cathode 16 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in commonly-assigned U.S. Pat. No. 4,885,221. Another suitable class of cathode materials includes bilayers including a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in commonly-assigned U.S. Pat. No. 5,677,572. Other useful cathode material sets include, but are not limited to, those disclosed in commonly-assigned U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211; 5,247,190, JP 3,234,963; 5,703,436; 5,608,287; 5,837,391; 5,677,572; 5,776,622; 5,776,623; 5,714,838; 5,969,474; 5,739,545; 5,981,306; 6,137,223; 6,140,763; 6,172,459, EP 1 076 368, and U.S. Pat. No. 6,278,236. Cathode materials are typically deposited by evaporation, sputtering, or chemical vapor deposition. When needed, patterning can be achieved through many well known methods including, but not limited to, through-mask deposition, integral shadow masking as described in commonly-assigned U.S. Pat. No. 5,276,380 and EP 0 732 868, laser ablation, and selective chemical vapor deposition.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in commonly-assigned U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (commonly-assigned U.S. Pat. No. 5,294,870), spatially-defined thermal dye transfer from a donor sheet (commonly-assigned U.S. Pat. Nos. 5,851,709 and 6,066,357) and inkjet method (commonly-assigned U.S. Pat. No. 6,066,357).

Encapsulation

Most OLED apparatus are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in commonly-assigned U.S. Pat. No. 6,226,890. In addition, barrier layers such as SiOx, Teflon, and alternating inorganic/polymeric layers are known in the art for encapsulation.

Optical Optimization

The OLED apparatus of this invention employs a plurality of OLED devices that use various well-known optical effects in order to enhance its properties if desired. This includes optimizing layer thickness to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

Figure 3:
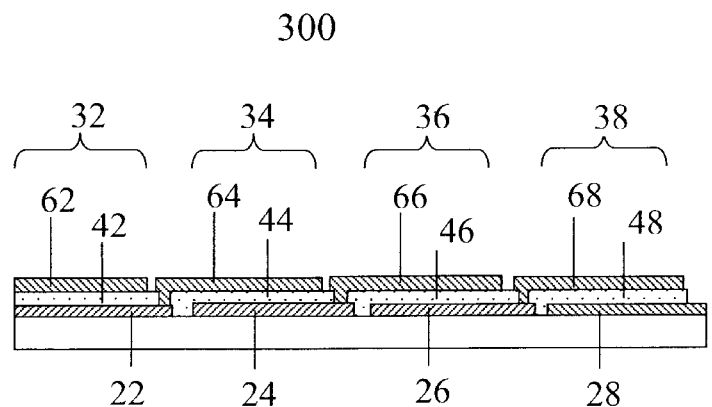
FIG. 3 is a schematic illustration of the cross section of an OLED apparatus according to the present invention.

FIG. 3 is a schematic representation of the cross-section of an OLED apparatus 300 according to the present invention having a plurality of OLED devices 32, 34, 36, and 38 connected in series. For ease of illustration, only four OLED devices 32, 34, 36, and 38 are shown. It is understood that in most applications many more OLED devices will be involved. On top of substrate 10 there is a plurality of spaced apart bottom electrodes 22, 24, 26, and 28 one for each OLED device. The spaced apart bottom electrodes 22, 24, 26, and 28 can be provided by vacuum deposition through masks or printed into the desired pattern using ink containing the electrode material. Alternatively, the spaced apart bottom electrodes 22, 24, 26, and 28 can be prepared in a continuous layer and divided into the desired spaced apart pattern using photolithography, laser scribing, or mechanical scribing. Over the spaced apart bottom electrodes 22, 24, 26, and 28, there is disposed a plurality of spaced apart organic EL elements, 42, 44, 46, and 48. Each one of the spaced apart organic EL elements 42, 44, 46 and 48 has at least one organic layer that extends over an edge of its corresponding spaced apart bottom electrodes 22, 24, 26 and 28. In FIG. 3 each spaced apart organic EL elements 42, 44, 46, and 48 covers the left edge of its corresponding spaced apart bottom electrodes 22, 24, 26 and 28. The organic layers of each organic EL element 42, 44, 46 and 48 can end in the space between adjacent spaced apart bottom electrodes 22, 24, 26, and 28 or it can extend beyond the space and covers the right edge of the next spaced apart bottom electrode 22, 24, 26, and 28 to its left. Over the spaced apart organic EL elements 42, 44, 46 and 48, there is disposed a plurality of spaced apart top electrodes 62, 64, 66, and 68. Each spaced apart top electrode 62, 64, 66, and 68 is disposed over a substantial portion of its corresponding spaced apart organic EL element 42, 44, 46, and 48. A set of corresponding spaced apart bottom electrode, spaced apart organic EL element, and spaced apart top electrode forms an OLED device that can emit light. Each spaced apart top electrode extends beyond the space between its corresponding bottom electrode and the next space apart bottom electrode and makes electrical contact with the latter. Thus the spaced apart top electrode of OLED device 38 contacts the spaced apart bottom electrode of OLED device 36; the spaced apart top electrode of OLED device 36 contacts the spaced apart bottom electrode of OLED device 34; and so on. In operation a voltage is applied between the top electrode 62 of device 32 and the bottom electrode 28 of device 38 and the operating current flows from one device into the next causing all device to emit simultaneously. The drive voltage is the sum of that of the four OLED devices 32, 34, 36 and 38, but the drive current is that of a single OLED device which is only one quarter of that of a single OLED device of equivalent total area as the OLED apparatus 300. Since the power loss due to series resistance equals the square of the operating current times the series resistance, it is drastically reduced when compared with an OLED including a single OLED device instead of four OLED devices. The spaced apart organic EL elements and the spaced apart top electrodes can be prepared by conventional masking, printing, or scribing methods similar to those used for making spaced apart bottom electrodes and selected based on the organic materials and top electrode materials used.

Figure 4:
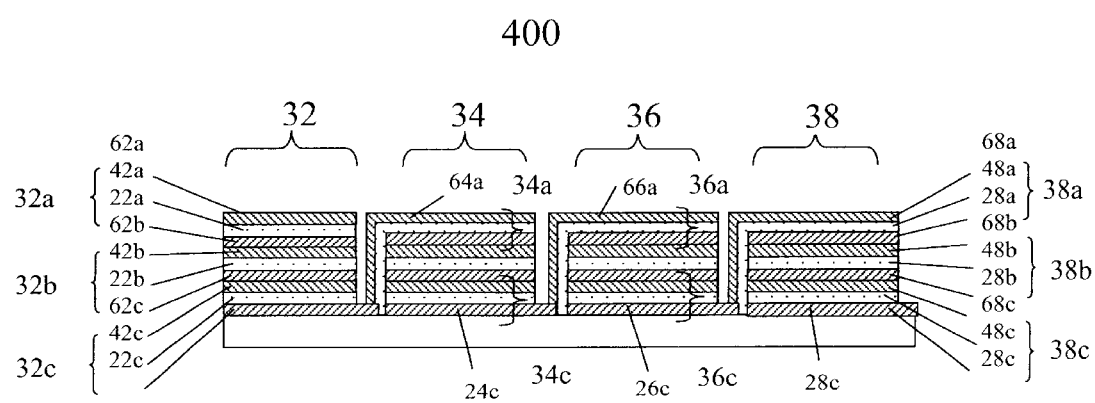
FIG. 4 is a schematic illustration of the cross section of an OLED apparatus according to the present invention comprising stacked cells.

OLED devices 32, 34, 36, and 38 can also be stacked OLED devices. In this case each OLED device 32, 34, 36, and 38 includes a spaced apart top electrode, a spaced apart bottom electrode, and a plurality of individual light emitting devices stacked between the two electrodes. There can be inter-device electrodes between the neighboring individual light emitting devices, as taught in U.S. Pat. No. 6,337,492. Alternatively, as taught by commonly assigned U.S. patent application Ser. No. 10/077,720 by Liao et al, a doped organic connector can be used between the individual light emitting devices. FIG. 4 is a schematic representation of the cross section of an OLED apparatus 400 including a plurality of stacked OLED devices having inter-device electrodes. For ease of illustration, each OLD devices 32, 34, 36, and 38 includes three individual light emitting devices. OLED device 32, for example, includes three individual light emitting devices 32a, 32b, 32c. The top individual light emitting device 32a includes a spaced apart top electrode 62a, a spaced apart light emitting element 42a, and a spaced apart inter-device electrode 22a; the middle individual emitting device 32b includes a spaced apart inter-device electrode 62b, a spaced apart light emitting element 42b, and a spaced apart inter-device electrode 22b; the bottom individual emitting device 32c includes a spaced apart inter-device electrode 62c, a spaced apart light emitting element 42c, and a spaced apart bottom electrode 22c. The spaced apart top electrode 64a of the top individual light emitting device 34a of OLED device 34 is made to be in contact with the spaced apart bottom electrode 22c of the bottom individual light emitting device 32c of OLED device 32. The spaced apart top electrode 66a of the top individual light emitting device 36a of OLED device 36 is made to be in contact with the spaced apart bottom electrode 24c of the bottom individual light emitting device 34c of OLED device 34; the spaced apart top electrode 68a of the top individual light emitting device 38a of OLED device 38 is made to be in contact with the spaced apart bottom electrode 26c of the bottom individual light emitting device 36c of OLED device 36. OLED devices 32, 34, 36, and 38 are thus connected in series. To operate the apparatus, an electric current is applied between spaced apart top electrode 62a of the top individual light emitting device 32a of OLED device 32 and the spaced apart bottom electrode 28c of the bottom individual light emitting device 38c of OLED device 38. This current will flow through all the individual light emitting devices of all OLED devices 32, 34, 36, and 38 and cause light to emit in all the individual light emitting devices. Comparing with a conventional OLED device having the same device area and operating at the same brightness level, apparatus 400 according to the current invention will operate at twelve times the voltage but only one twelfth of the current. The loss due to series resistance is thus drastically reduced.

Staying with FIG. 4 and use individual light emitting device 32b as an example, it can be seen that the inter-device spaced apart top electrode 62b and the spaced apart bottom electrode 22b do not need to have high lateral electrical conductance. The function of these electrodes is to supply positive and negative charges into the individual organic EL element 42b, and to have enough electrical conductivity to allow current to flow through the thickness of these layers. Material with electrical resistivity as high as $10^8$ ohm-cm can be used for these inter-device electrodes if the thickness of these electrodes is small. On the other hand, the spaced apart top electrodes 62a, 64a, 66a, 68a of the uppermost individual light emitting devices 32a, 34a, 36a, 38a; and the spaced apart bottom electrodes 22c, 24c, 26c, 28c of the lowermost individual light emitting devices 32a, 34c, 36c, 38c need to have high lateral electrical conductance to reduce loss of energy due to series resistance. For these layers, the electrical resistivity needs to be $10^{-3}$ ohm-cm or lower. For fabricating OLED apparatus according to the present invention using stacked OLED devices it is in fact preferable to use materials of high electrical resistivity for the inter-device electrodes. Focusing on OLED device 38 in FIG. 4, the spaced apart top electrode 68a extends to the left beyond the end edges of all the other layers 48a, 28a, 68b, 48b, 28b, 68c, 48c, 28c so that it is be made to contact the spaced apart bottom electrode 26c of the next OLED device 36. Using a high resistivity material for the inter-device electrode layers 28a, 68b, 28b, 68c helps preventing the individual light emitting devices from being shorted if there happen to be accidental contacts between spaced apart electrode 68a and the other inter-device electrode layers 28a, 68b, 28b, 68c.

Figure 4A:
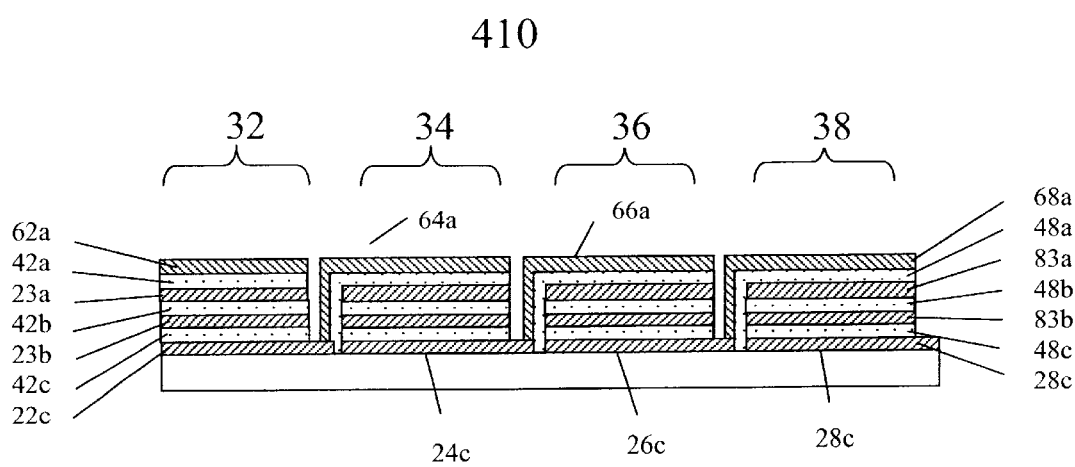
FIG. 4a is a schematic illustration of the cross section of an OLED apparatus according to the present invention comprising stacked cells.

Alternatively stacked OLED devices as taught by the above-cited commonly-assigned U.S. patent application Ser. No. 10/077,720 by Liao et al. can be used. Instead of inter-device electrodes, doped organic connectors are used in between the stacked individual light emitting devices. FIG. 4a shows an OLED apparatus 410 according to the present invention including serially connected stacked OLED devices based on doped organic connectors. On a common substrate 10 there are four OLED devices 32, 34, 36, 38 each including a stack of three individual light emitting devices. Correspondingly there are four spaced apart top electrodes 62a, 64a, 66a, 68a; four spaced apart bottom electrodes 22c, 24c, 26c, and 28c. Between each pair of spaced apart top electrodes and spaced apart bottom electrodes, 62a and 22c; 64a and 24c; 66a and 26c; 68a and 28c, there are three individual light emitting devices connected by doped organic connectors. For example, doped organic connectors 23a and 23b are used to connect the three stacked individual devices in OLED device 32, doped organic connectors 83a and 83b are used to connect the three stacked individual devices in OLED device 38, etc. The spaced apart top electrode of OLED device 34 is made to be in contact with the spaced bottom electrode 22c OLED device 32. The spaced apart top electrode 66a of OLED device 36 is made to be in contact with the spaced apart bottom electrode 24c of OLED device 34; the spaced apart top electrode 68a OLED device 38 is made to be in contact with the spaced bottom electrode 26c of OLED device 36. OLED devices 32, 34, 36, and 38 are thus connected in series. To operate the apparatus, an electric current is applied between spaced apart top electrode 62a of OLED device 32 and the spaced apart bottom electrode 28c of OLED device 38. This current will flow through all the individual light emitting devices of all OLED devices 32, 34, 36, and 38 and cause light to emit in all the individual light emitting devices. Comparing with a convention OLED device having the same device area and operating at the same brightness level, apparatus 400 according to the current invention will operate at twelve times the voltage but only one twelfth of the current. The loss due to series resistance is thus drastically reduced.

Figure 5:
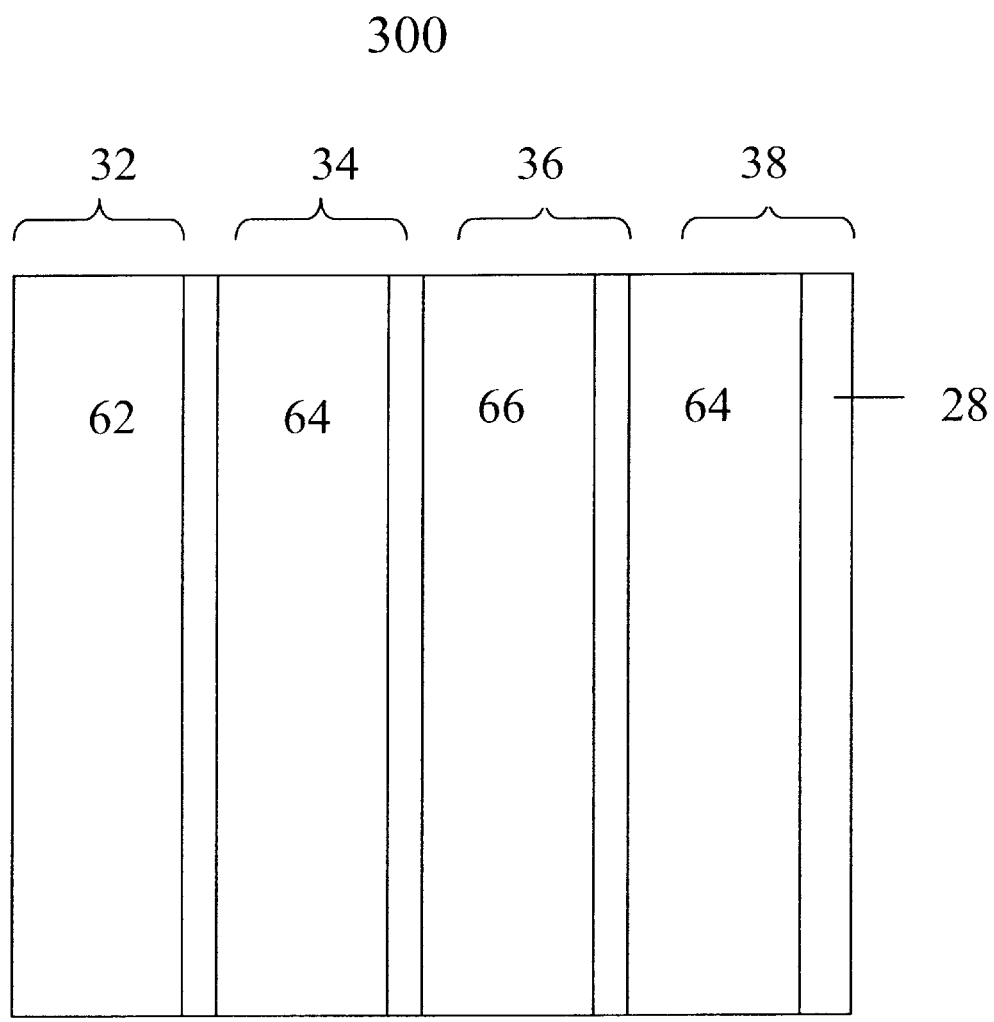
FIG. 5 is a schematic illustration of the top-view of an OLED apparatus according to the present invention.

FIG. 5 is a schematic representation of the top view of OLED apparatus 300 showing OLED devices 32, 34, 36, 38; their corresponding spaced apart top-electrodes: 62, 64, 66, and 68; and one spaced apart bottom electrode, 28.

In addition to reducing power loss due to series resistance, another advantage of the present invention is that, when an OLED apparatus is divided into OLED devices connected in series, a shorting defect can only render the OLED device it resides in non-operative. The remaining OLED devices in the series can continue to emit light. The output of the OLED device as a whole is reduced, but this situation is much better than having the entire device totally non-operative due to a single shorting defect.

Figure 6:
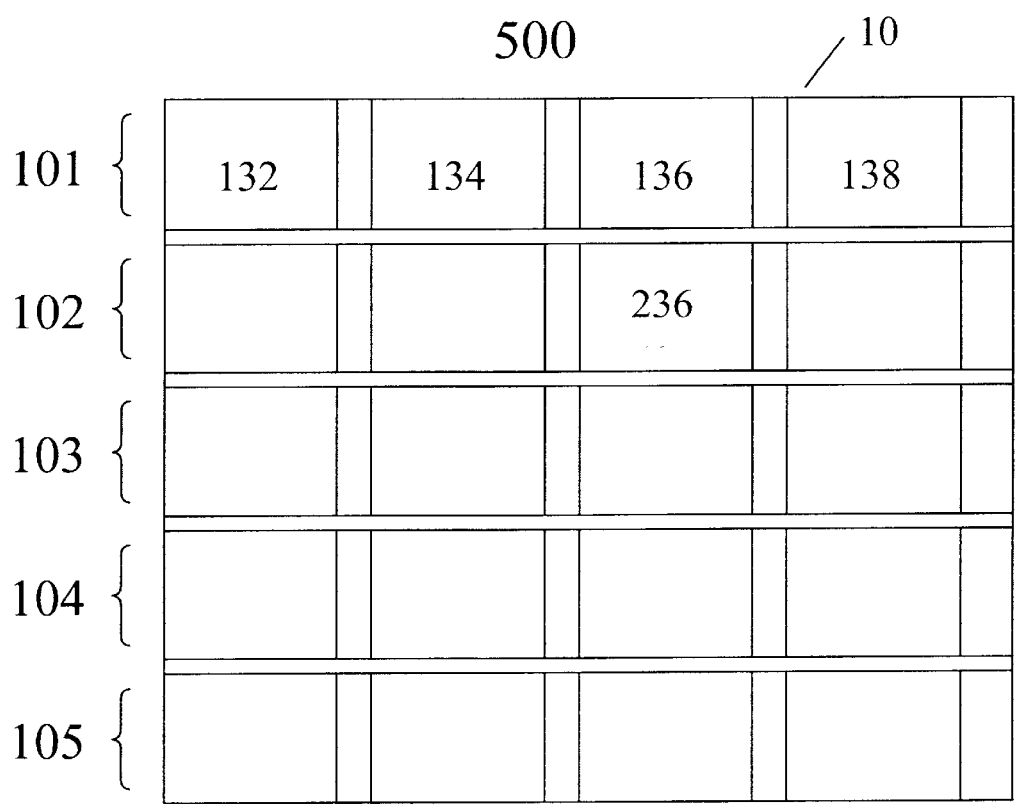
FIG. 6 is a schematic illustration of an array of electrically isolated OLED apparatus according to the current invention on a common substrate.

FIG. 6 depicts another embodiment of the present invention showing an array 500 having five OLED apparatus 101, 102, 103, 104, and 105, on a common substrate 10. Each of the five OLED apparatus 101, 102, 103, 104, and 105 includes four OLED devices connected in series according to the present invention. For example, OLED apparatus 101 includes OLED devices 132, 134, 136, and 138 connected in series. OLED apparatus 101, 102, 103, 104, and 105 are electrically isolated from each other except at the ends where they can be connected so that the five apparatus can operate in parallel. This embodiment is used to divide a large area OLED device into many small devices that are connected in series and then in parallel. This embodiment not only reduces power loss due to series resistance it further reduces damaging effect due to shorting defects. If there is a shorting defect, only the OLED device it resides in is affected. For example, if there is a shorting defect in OLED device 236 of OLED apparatus 103, only OLED device 236 is affected and the total output of array 500 is only reduced by 1/20. Thus the impact of shorting defects is greatly reduced.

In another embodiment of the present invention, OLED apparatus 101, 102, 103, 104, and 105 can contain different organic EL elements to emit light of different colors. Some of the OLED apparatus can be made to emit blue lights, some red lights, and some green lights. Each OLED apparatus can emit a single colored light so as to form a repeating pattern of different colored light. A conventional electrical structure can be used to connect the bottom electrodes of the first OLED devices of all OLED apparatus that produce the same colored light. Similarly, the top electrodes of the last OLED devices of all OLED apparatus that produce the same colored light can be connected. OLED apparatus 101, 102, 103, 104, and 105 can also be driven independently to achieve different intensity levels. Alternatively, if OLED apparatus 101, 102, 103, 104, and 105 are not equally efficient, they can be driven to different levels to achieve uniform intensity levels.

Alternatively the top electrode of the first OLED device in each OLED apparatus of the array can be electrically connected and the bottom electrode of the last OLED device of each OLED apparatus of the array can be electrically connected. All the OLED apparatus are thus connected in parallel and can be driven off a common power supply.

Figure 7:
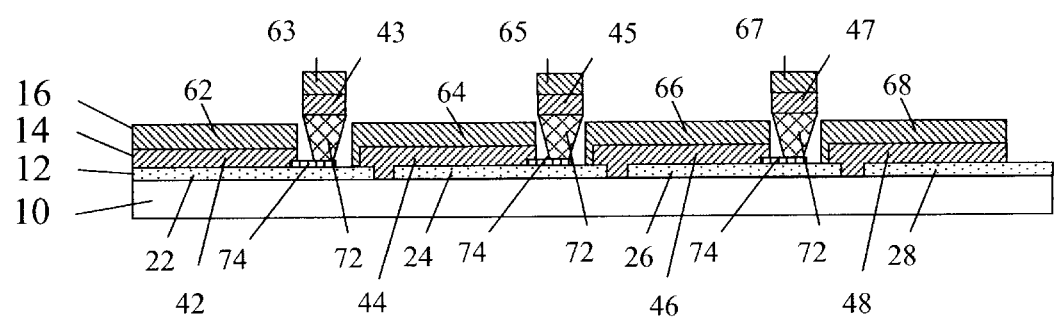
FIG. 7 is a schematic illustration of the cross section of an OLED apparatus according to the present invention using a built-in pillar structure.

FIG. 7 depicts another embodiment of the current invention wherein pillar structures are used as built-in shadow masks for fabricating the spaced apart organic EL elements 42, 44, 46 and 48 and the spaced apart top electrodes 62, 64, 66, and 68. In this structure, a plurality of spaced apart bottom electrodes 22, 24, 26, and 28 are provided over substrate 10. A plurality of spaced apart pillar structures 72 and 74 are then fabricated by photolithography over the spaced apart bottom electrodes 22, 24, 26 and 28. A vacuum deposition process is then used to prepare the spaced apart organic EL element 42, 44, 46 and 48 and the spaced apart top electrode 62, 64, 66 and 68 using pillars 72 and 74 as built-in shadow masks. The coating of organic element materials 43, 45, 47 on top of pillars 72, and 74 and the coating of top electrode materials 63, 65, 67 on top of pillars 72 and 74 allows the spaced apart organic EL element 42, 44, 46 and 48 and the spaced apart top electrodes 62, 64, 66 and 68 to be spaced apart from each other. The position of spaced apart pillars 72 and 74 are such that each spaced apart top electrode is in contact with its next adjacent spaced apart bottom electrode to form the series connection.

The invention has been described in detail with particular reference to certain preferred embodiments thereof, but it will be understood that variations and modifications can be effected within the spirit and scope of the invention.

Parts List 10 substrate
14 organic EL element
15 hole transport layer
19 electron transport layer
12 anode layer
13 hole injecting layer
16 cathode layer
17 light-emitting layer
22 spaced apart bottom electrode
22c spaced apart bottom electrode
22a inter-device electrode
22b inter-device electrode
23a doped organic connectors
23b doped organic connectors
24 spaced apart bottom electrode
24c spaced apart bottom electrode
26 spaced apart bottom electrode 26c spaced apart bottom electrode
28 spaced apart bottom electrode
28c spaced apart bottom electrode
28a inter-device electrode
28b inter-device electrode
32 OLED device
32a individual light emitting device
32b individual light emitting device
32c individual light emitting device
34 OLED device
34a individual light emitting device
34c individual light emitting device
36 OLED device
36a individual light emitting device
36c individual light emitting device
38 OLED device
38a individual light emitting device
38b individual light emitting device
38c individual light emitting device
42 spaced apart organic EL element
42a spaced apart organic EL element
42b spaced apart organic EL element
42c spaced apart organic EL element
43 organic EL element materials coated on top of pillars
44 spaced apart organic EL element
45 organic EL element materials coated on top of pillars
46 spaced apart organic EL element
47 organic EL element materials coated on top of pillars
48 spaced apart organic EL element
48a spaced apart organic EL element
48b spaced apart organic EL element
48c spaced apart organic EL element
62b inter-device electrode
62c inter-device electrode
62 spaced apart top electrode
62a spaced apart top electrode
63 top electrode materials coated on top of pillars
64 spaced apart top electrode
64a spaced apart top electrode
65 top electrode materials coated on top of pillars
66 spaced apart top electrode
66a spaced apart top electrode
67 top electrode materials coated on top of pillars
68 spaced apart top electrode
68a spaced apart top electrode
68b inter-device electrode
68c inter-device electrode
72 pillar
74 pillar
83a doped organic connectors
83b doped organic connectors
100 conventional OLED device
101 OLED apparatus
102 OLED apparatus
103 OLED apparatus
104 OLED apparatus
105 OLED apparatus
132 OLED device
134 OLED device
136 OLED device
138 OLED device
200 conventional OLED device
236 OLED device
300 OLED apparatus
400 OLED apparatus
410 OLED apparatus
500 array

What is claimed is:

1. An OLED apparatus comprising:
    (a) a substrate;
    (b) the plurality of OLED devices including spaced apart bottom electrodes disposed over the substrate;
    (c) each one of the spaced apart OLED devices including at least one organic layer extending over an edge of its corresponding spaced apart bottom electrode; and
    (d) each one of the plurality of OLED devices including a top electrode spaced apart from the other top electrodes and extending into electrical contact with the spaced apart bottom electrode of a neighboring OLED device so that a series connection of OLED devices is provided and current flows between the spaced apart top and bottom electrodes of each OLED device and from the spaced apart bottom electrode of such OLED device to the spaced apart top electrode of the next OLED device which reduces power loss due to series resistance.

2. The OLED apparatus of claim 1 wherein at least one organic layer of each OLED device terminates in the space between adjacent spaced apart bottom electrodes or extends into contact with the next adjacent spaced apart bottom electrode.

3. The OLED apparatus of claim 2 wherein the spaced apart bottom electrodes are anodes and the spaced apart top electrodes are cathodes.

4. The OLED apparatus of claim 1 further including a plurality of spaced apart pillar structures each disposed on one spaced apart bottom electrode to provide the function of a shadow mask which permits the patterned deposition of the spaced apart organic layers and the spaced apart top electrodes and wherein each spaced apart top electrode is in contact with its next adjacent spaced apart bottom electrode to form the series connection.

5. The array of OLED apparatus on the common substrate which are electrically insulated from each other and wherein each OLED apparatus is in accordance with claim 1.

6. The array of OLED apparatus of claim 5 wherein the top electrodes of the first OLED devices in each OLED apparatus are electrically connected and wherein the bottom electrodes of the last OLED devices of each OLED apparatus are electrically connected.

7. The array of OLED apparatus of claim 5 wherein each OLED device of the array emits colored light.

8. The array of OLED apparatus of claim 7 wherein the colored light is red, green or blue.

9. The array of OLED apparatus of claim 7 wherein each OLED device of the array emits colored light so as to form a repeating pattern of red, green and blue.

10. The array of OLED apparatus of claim 5 wherein each OLED apparatus emits a single colored light so as to form a repeating pattern of different colored light and further including means for electrically connecting the bottom electrodes of the first OLED devices of all OLED apparatus that produce the same color and the top electrodes of the last OLED devices of all OLED apparatus that produce the same color are electrically connected.

11. The array of claim 10 further including means for controlling the current flow through the electrodes of the OLED apparatus to adjust the color of light produced by the array.

12. A method of making an OLED apparatus comprising the steps of:
    (a) forming a substrate; and
    (b) forming the plurality of OLED devices including spaced apart bottom electrodes disposed over the substrate, each one of the spaced apart OLED devices including at least one organic layer extending over an edge of its corresponding spaced apart bottom electrode, each one of the plurality of OLED devices including a top electrode spaced apart from the other top electrodes and extending into electrical contact with the spaced apart bottom electrode of a neighboring OLED device so that a series connection of OLED devices is provided and current flows between the spaced apart top and bottom electrodes of each OLED device and from the spaced apart bottom electrode of such OLED device to the spaced apart top electrode of the next OLED device which reduces power loss due to series resistance.

13. An OLED apparatus comprising:

(a) a substrate;

(b) the plurality of stacked OLED devices disposed over the substrate wherein each one of the plurality of stacked OLED devices including a spaced apart top electrode, a spaced apart bottom electrode, and the plurality of individual light emitting devices stacked in between the spaced apart top electrode and the spaced apart bottom electrode;

(c) each one of the plurality of stacked OLED devices further including doped organic connector disposed between neighboring individual light emitting devices;

(d) each one of the plurality of stacked OLED devices further including at least one organic layer disposed over one edge of the spaced apart bottom electrode of the same stacked OLED device;

(e) the spaced apart top electrode of each one of the plurality of stacked OLED devices extending beyond the said one edge of the spaced apart organic layer of the same stacked OLED device and making electrical contact with the spaced apart bottom electrode of the next stacked OLED device so that the plurality of stacked OLED devices are connected in series.

14. The OLED apparatus of claim 13 wherein at least one organic layer of each OLED device terminates in the space between adjacent spaced apart bottom electrodes or extends into contact with the next adjacent spaced apart bottom electrode.

15. The OLED apparatus of claim 13 wherein the spaced apart bottom electrodes are anodes and the spaced apart top electrodes are cathodes.

16. The OLED apparatus of claim 13 further including a plurality of spaced apart pillar structures each disposed on one spaced apart bottom electrode to provide the function of a shadow mask which permits the patterned deposition of the spaced apart organic layers and the spaced apart top electrodes and wherein each spaced apart top electrode is in contact with its next adjacent spaced apart bottom electrode to form the series connection.

17. The array of OLED apparatus on the common substrate which are electrically insulated from each other and wherein each OLED apparatus is in accordance with claim 13.

18. The array of OLED apparatus of claim 17 wherein the top electrodes of the first OLED devices in each OLED apparatus are electrically connected and wherein the bottom electrodes of the last OLED devices of each OLED apparatus are electrically connected.

19. The array of OLED apparatus of claim 17 wherein each OLED device of the array emits colored light.

20. The array of OLED apparatus of claim 19 wherein the colored light is red, green or blue.

21. The array of OLED apparatus of claim 19 wherein each OLED device of the array emits colored light so as to form a repeating pattern of red, green and blue.

22. The array of OLED apparatus of claim 17 wherein each OLED apparatus emits a single colored light so as to form a repeating pattern of different colored light and further including means for electrically connecting the bottom electrodes of the first OLED devices of all OLED apparatus that produce the same color and the top electrodes of the last OLED devices of all OLED apparatus that produce the same color are electrically connected.

23. The array of claim 22 further including means for controlling the current flow through the electrodes of the OLED apparatus to adjust the color of light produced by the array.

24. A method of making an OLED apparatus comprising the steps of:

(a) forming a substrate; and (b) forming a plurality of stacked OLED devices including spaced apart bottom electrodes disposed over the substrate, each one of the spaced apart OLED devices including at least one organic layer extending over an edge of its corresponding spaced apart bottom electrode, each one of the plurality of OLED devices including a top electrode spaced apart from the other top electrodes and extending into electrical contact with the spaced apart bottom electrode of a neighboring OLED device so that a series connection of OLED devices is provided and current flows between the spaced apart top and bottom electrodes of each OLED device and from the spaced apart bottom electrode of such OLED device to the spaced apart top electrode of the next OLED device which reduces power loss due to series resistance.

25. An OLED apparatus comprising:

(a) a substrate;

(b) the plurality of stacked OLED devices disposed over the substrate wherein each one of the plurality of stacked OLED devices including a spaced apart top electrode, a spaced apart bottom electrode, and the plurality of individual light emitting devices stacked in between the spaced apart top electrode and the spaced apart bottom electrode (c) each one of the plurality of stacked OLED devices further including inter-device electrodes disposed between neighboring individual light emitting devices, (d) each one of the plurality of stacked OLED devices further including at least one organic layer disposed over one edge of the spaced apart bottom electrode of the same stacked OLED device, (e) the spaced apart top electrode of each one of the plurality of stacked OLED devices extending beyond the said one edge of the spaced apart organic layer of the same stacked OLED device and making electrical contact with the spaced apart bottom electrode of the next stacked OLED device so that the plurality of stacked OLED devices are connected in series.

26. The OLED apparatus of claim 25 wherein at least one organic layer of each OLED device terminates in the space between adjacent spaced apart bottom electrodes or extends into contact with the next adjacent spaced apart bottom electrode.

27. The OLED apparatus of claim 25 wherein the spaced apart bottom electrodes are anodes and the spaced apart top electrodes are cathodes.

28. The OLED apparatus of claim 25 further including a plurality of spaced apart pillar structures each disposed on one spaced apart bottom electrode to provide the function of a shadow mask which permits the patterned deposition of the spaced apart organic layers and the spaced apart top electrodes and wherein each spaced apart top electrode is in contact with its next adjacent spaced apart bottom electrode to form the series connection.

29. The array of OLED apparatus of claim 28 wherein at least one organic layer of each OLED device terminates in the space between adjacent spaced apart bottom electrodes or extends into contact with the next adjacent spaced apart bottom electrode.

\* \* \* \* \*